(12) United States Patent
Tokuda

(10) Patent No.: US 6,340,798 B1
(45) Date of Patent: Jan. 22, 2002

(54) PRINTED CIRCUIT BOARD WITH REDUCED CROSSTALK NOISE AND METHOD OF FORMING WIRING LINES ON A BOARD TO FORM SUCH A PRINTED CIRCUIT BOARD

(75) Inventor: Kazuhiko Tokuda, Kawasaki (JP)

(73) Assignee: Fujitsu Limited, Kanagawa (JP)

( * ) Notice: Subject to any disclaimer, the term of this patent is extended or adjusted under 35 U.S.C. 154(b) by 0 days.

(21) Appl. No.: 09/630,685

(22) Filed: Aug. 1, 2000

(30) Foreign Application Priority Data

Nov. 30, 1999 (JP) ............................................ 11-340815

(51) Int. Cl.[7] ................................................. H01R 9/09
(52) U.S. Cl. ...................... 174/261; 361/772; 361/777; 439/88; 439/90
(58) Field of Search ................................ 174/250, 261, 174/262, 117 FF; 430/318; 439/88, 65, 84, 90; 361/768, 772, 777

(56) References Cited

U.S. PATENT DOCUMENTS

| 5,454,738 | A | * | 10/1995 | Lim et al. ................... 439/676 |
| 5,675,299 | A | * | 10/1997 | Suski ............................ 333/1 |
| 6,103,134 | A | * | 8/2000 | Dunn et al. ................. 430/318 |
| 6,255,568 | B1 | * | 6/2001 | Lin et al. ................. 174/117 F |

FOREIGN PATENT DOCUMENTS

| JP | 61-123170 | 6/1986 |
| JP | 1-310560 | 12/1989 |
| JP | 5-166948 | 7/1993 |

* cited by examiner

Primary Examiner—Albert W. Paladini
(74) Attorney, Agent, or Firm—Armstrong, Westerman, Hattori, McLeland & Naughton, LLP

(57) ABSTRACT

A printed circuit board includes a first wiring line and a second wiring line spaced apart from the first wiring line. The first wiring line has a first portion having a surface which faces the second wiring line and is smaller in area than that of the second portion, so that a crosstalk noise between the first portion of the first wiring line and the second wiring line can be reduced.

30 Claims, 10 Drawing Sheets

PRINTED CIRCUIT BOARD WITH REDUCED CROSSTALK NOISE AND METHOD OF FORMING WIRING LINES ON A BOARD TO FORM SUCH A PRINTED CIRCUIT BOARD

BACKGROUND OF THE INVENTION

1. Field of the Invention

The present invention generally relates to printed circuit boards and methods of forming wiring lines on boards to form such printed circuit boards, and more particularly, to a printed circuit board with reduced crosstalk noise generated between adjacent two of a plurality of wiring lines spaced thereon, and a method of forming wiring lines on a board to form such a printed circuit board.

2. Description of the Related Art

A plurality of wiring lines and electronic components are disposed on a printed circuit board, so that a crosstalk noise will be generated between adjacent two of the wiring lines which are not sufficiently spaced. Here, the term "crosstalk noise" refers to a noise which is generated when a signal conducted through a signal (wiring) line is induced by an adjacent signal (wiring) line because of a coupling caused by a mutual capacitance or inductance between the adjacent signal (wiring) lines. When a high-frequency clock pulse is employed as a signal, the problem of false operation caused by such a crosstalk noise will surface.

For example, according to a wiring layout on a printed circuit board 1 shown in FIG. 1, a plurality of LSIs 2a, 2b, and 2c are connected by means of a plurality of wiring lines. In FIG. 1, adjacent two of the wiring lines are laid out at a distance X1 from each other in a region 150, adjacent two of the wiring lines which are disposed so as to bypass electronic components 3a and 3b are laid out at a distance X2-1 from each other in a region 160, and adjacent two of the wiring lines which are disposed with high density are laid out at a distance X2-2 from each other in a region 170.

Herein, the distance X1 is longer than the distances X2-1 and X2-2. Therefore, the noise level of a crosstalk noise generated between the adjacent two of the wiring lines laid out in the region 150 is higher than those generated between the adjacent two of the wiring lines laid out in the region 160 and between the adjacent two of the wiring lines laid out in the region 170.

In order to avoid the above drawback, a change in the wiring layout is generally made so as to lengthen the distances X2-1 and X2-2, which in turn, requires a greater wiring region or multiple wiring layers.

Hereinafter, a distance between two adjacent wiring lines is referred to as a pattern pitch.

SUMMARY OF THE INVENTION

It is a general object of the present invention to provide a printed circuit board and a method of forming wiring lines on a board to form such a printed circuit board in which the above disadvantages are eliminated.

A more specific object of the present invention is to provide a high-density printed circuit board with reduced crosstalk noise and a method of forming wiring lines on a board to form such a printed circuit board.

The above objects of the present invention are achieved by a printed circuit board including a first wiring line and a second wiring line spaced apart from the first wiring line, wherein the first wiring line has first and second portions, the first portion having a surface which faces the second wiring line and is smaller in area than that of the second portion.

The above objects of the present invention are achieved by a printed circuit board including a first wiring line and a second wiring line spaced apart from the first wiring line, wherein the first wiring line has a first portion having a surface which faces the second wiring line and is smaller in area than a surface of the second wiring line which faces the first portion of the first wiring line.

According to the above structures, the area of the overlapping part of the facing surfaces of adjacent two of wiring lines per unit length of a wiring line can be reduced so as to reduce a crosstalk noise between the adjacent two wiring lines.

The above objects of the present invention are also achieved by a method of forming wiring lines on a board to form a printed circuit board including the steps of forming the wiring lines of a predetermined uniform thickness, and etching a first wiring line thereof so that the first wiring line has a first portion thinner than a second portion thereof.

The above objects of the present invention are also achieved by a method of forming wiring lines on a board to form a printed circuit board including the steps of forming the wiring lines of a predetermined uniform thickness, and applying a conductive material on a first wiring line thereof so that the first wiring line has a first portion thicker than a second portion thereof.

The above objects of the present invention are also achieved by a method of forming wiring lines on a board to form a printed circuit board including the steps of forming the wiring lines of a predetermined uniform thickness, and grinding a first wiring line thereof so that the first wiring line has a first portion thinner than a second portion thereof.

According to the above methods, the printed circuit boards of the present invention may properly be formed.

BRIEF DESCRIPTION OF THE DRAWINGS

Other objects, features and advantages of the present invention will become more apparent from the following detailed description when read in conjunction with the accompanying drawings, in which.

DETAILED DESCRIPTION OF THE PREFERRED EMBODIMENTS

In the following, embodiments of the present invention will be described with reference to the accompanying drawings.

A description will first be given of a formula to calculate a coefficient K which indicates the amplitude of a crosstalk noise. The noise level of the crosstalk noise generated in any portion of a printed circuit board can be estimated by using the following formula. As the coefficient K becomes greater, the level of the crosstalk noise becomes higher.

$$K = (Lm/Lo + Cm/Co) \times Td \times 1 \times (dV/dt)$$

In the above formula, K is the coefficient to indicate the amplitude of the crosstalk noise, Lm is a mutual inductance between two adjacent wiring lines per unit length of a wiring line (unit: H), Lo is an inductance of one of the two adjacent wiring lines per unit length of a wiring line (unit: H), Cm is a mutual capacitance between the two adjacent wiring lines per unit length of a wiring line (unit: F), Co is a capacitance of one of the two adjacent wiring lines per unit length of a wiring line (unit: F), Td is a propagation delay time per unit length of a wiring line (unit: m/s), 1 is a length of a coupled portion of one of the two adjacent wiring lines (unit: m), V is the amplitude of a signal source (unit: V), and t is time (unit: s).

Further, Cm is given as $Cm = \in \times Sm/dm$, wherein $\in$ is the dielectric constant of an insulator between the two adjacent wiring lines, Sm is the area of the overlapping part of the surfaces facing each other, or facing surfaces, of the two adjacent wiring lines per unit length of a wiring line, and dm is a distance between the facing surfaces of the two adjacent wiring lines. Moreover, Co is given as $Co = \in \times So/do$, wherein $\in$ is the dielectric constant of an insulator between the two adjacent wiring lines and a GND (ground) layer, So is the area of the overlapping part of the facing surfaces of one of the two adjacent wiring lines and the GND layer, and do is a distance between one of the two adjacent wiring lines and the GND layer.

In the present invention, according to the above formula, the value of K can be reduced, so as to lower the noise level of a crosstalk noise, by reducing Lm and Cm by setting the area Sm required to set the level of the crosstalk noise to a level equal to or lower than a desired level when other values such as dm, $\in$, and So cannot be changed, that is, Lo and Co remain constant.

A description will now be given, with reference to FIGS. 2A through 2C, of a structure of a printed circuit board 22 according to a first embodiment of the present invention.

Figure 2A:
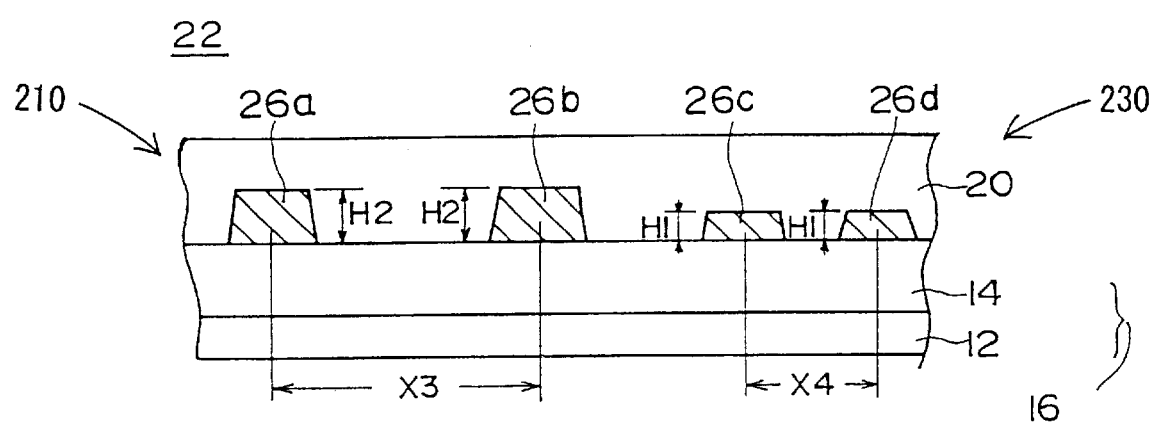
FIG. 2A is a partial cross-sectional view of a printed circuit board according to a first embodiment of the present invention.

FIG. 2A is a partial cross-sectional view of the printed circuit board 22 showing surrounding areas of a boundary between a region of a wide wiring pattern pitch and a region of a narrow wiring pattern pitch.

The printed circuit board 22 includes a board 16 having a GND layer 12 made of a conductive material, and a core layer 14 made of a dielectric material stacked on the GND layer 12. A plurality of wiring lines 26a through 26d (or a third, a fourth, a first, and a second wiring line, respectively) made of a conductive material are disposed on the board 16, being covered with a prepreg layer 20 made of a dielectric material.

Figure 2B:
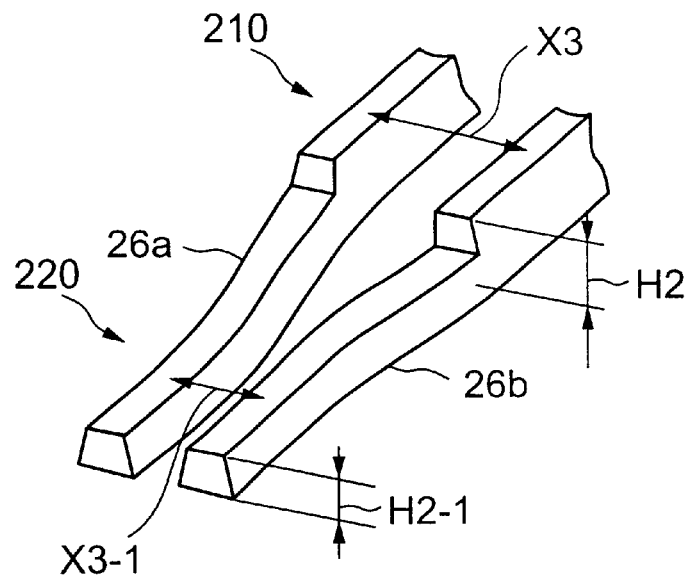
FIGS. 2B and 2C are partial perspective views of wiring lines formed on the printed circuit board of FIG. 2A.
Figure 2C:
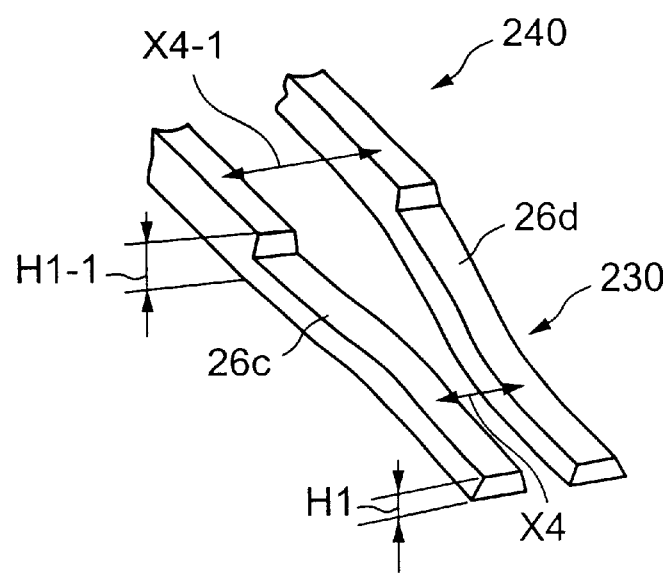

FIG. 2B is a partial perspective view of the wiring lines 26a and 26b including the portions thereof of which the cross sections are shown in FIG. 2A. FIG. 2C is a partial perspective view of the wiring lines 26c and 26d including the portions thereof of which the cross sections are shown in FIG. 2A.

As shown in FIG. 2B, the wiring lines 26a and 26b have portions of a height H2 in a region 210 (or a first and a third portion, respectively) and portions of a height H2-1 in a region 220 (or a second and a fourth portion, respectively). As shown in FIG. 2C, the wiring lines 26c and 26d have portions of a height H1 in a region 230 (or a first and a third portion, respectively) and portions of a height H1-1 in a region 240 (or a second and a fourth portion, respectively).

Figure 1:
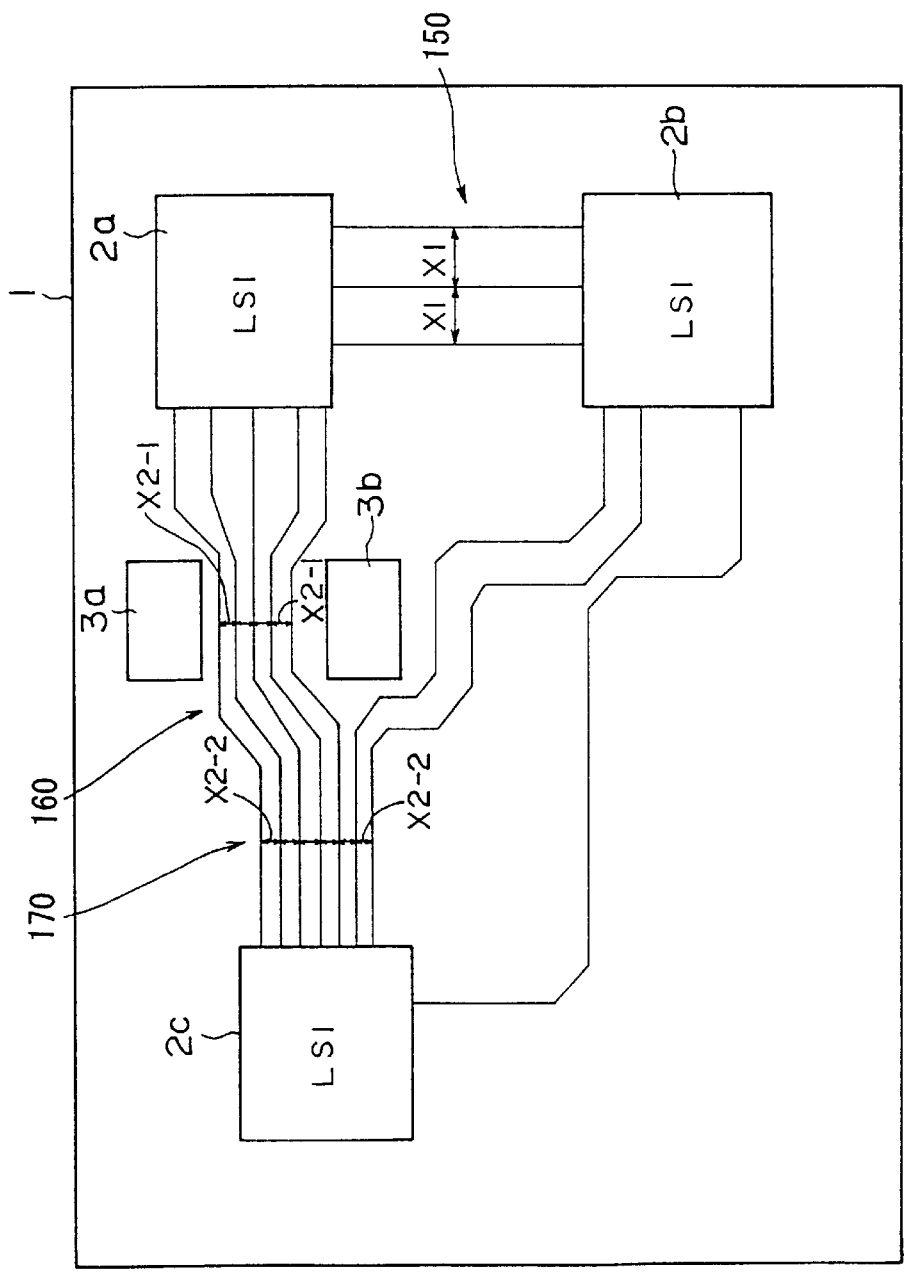
FIG. 1 is a diagram showing a conventional wiring layout on a printed circuit board.

The wiring lines 26a and 26b, as shown in FIG. 2B, have a wider pattern pitch X3 therebetween in the region 210 than a pattern pitch X3-1 therebetween in the region 220. On the other hand, the wiring lines 26c and 26d, as shown in FIG. 2C, have a narrower pattern pitch X4 therebetween in the region 230 than a pattern pitch X4-1 therebetween in the region 240 as the wiring lines 26c and 26d are laid out with high density because of the wiring layout restricted by a plurality of wiring lines and electronic components disposed on the board 16 (see FIG. 1).

The thickness H1 of the wiring lines 26c and 26d laid out with the pattern pitch X4 in the region 230 is thinner than the thickness H1-1 of the wiring lines 26c and 26d laid out with the pattern pitch X4-1 in the region 240. This is because the noise level of a crosstalk noise between the wiring lines 26c and 26d is estimated from the above described formula to calculate K to be improperly higher in the region 230 than in the region 240 because of the narrow pattern pitch X4 according to the wiring layout if the thickness of the wiring lines 26c and 26d remain the thickness H1-1. Accordingly, the thickness H1 is set so as to obtain a desired value of K indicating a desired low noise level of the crosstalk noise therebetween in the region 230, thus allowing a high-density wiring layout therein.

On the other hand, the thickness H2 of the wiring lines 26a and 26b laid out with the pattern pitch X3 in the region 210 is thicker than the thickness H2-1 of the wiring lines 26a and 26b laid out with the pattern pitch X3-1 in the region 220. This is because the noise level of a crosstalk noise between the wiring lines 26a and 26b is estimated from the above described formula to be lower in the region 210 than in the region 220 because of the wide pattern pitch X3 according to the wiring layout if the thickness of the wiring lines 26a and 26b remain the thickness H2-1. Accordingly, the thickness H2 is set within a given range so that the noise level of the crosstalk noise will not become improperly high. The thickness H1-1 is equal to the thickness H2-1 since wiring lines are usually formed so as to have the same thickness.

According to the printed circuit board 22 having the above structure, the area Sm of the overlapping part of the facing surfaces of the wiring lines 26c and 26d per unit length is smaller in the region 230 than in the region 240. This is because the wiring lines 26c and 26d each have the thinner thickness H1-1 in the region 230 than the thickness H1-1 in the region 240. Therefore, a mutual capacitance between the wiring lines 26c and 26d per unit length in the region 230 is smaller than that between wiring lines of the thickness H1-1 per unit length which are laid out with the pattern pitch X4. Thus, the value of K obtained from the above formula becomes a desired value small enough to lower the noise level of the crosstalk noise between the wiring lines 26c and 26d in the region 230 to the extent that no problem is incurred.

If the pattern pitch X4 is replaced with the pattern pitch X4-1 between the wiring lines 26c and 26d in the region 230 in the above case, the crosstalk noise therebetween will further be reduced.

On the other hand, the wiring lines 26a and 26b are laid out with the wider pattern pitch X3 in the region 210 than the pattern pitch X3-1 in the region 220, and have the thicker thickness H2 in the region 210 than the thickness H2-1 in the region 220. Therefore, when the wiring lines 26a through 26d are connected to make a continuous circuit, for example, increases in the resistances of the thinner portions, or the first and third portions, respectively, of the wiring lines 26c and 26d in the region 230 are offset by decreases in the resistances of the thicker portions, or the first and third portions, respectively, of the wiring lines 26a and 26b in the region 210. In this case, the pattern pitch X3 may also be set as short as the pattern pitch X3-1 in the region 210 with the thickness H2 being replaced with the thickness H2-1, thus allowing a high density wiring layout in the region 210.

The above will become clearer when the wiring lines 26a and 26c are different portions of the same wiring line, and the wiring lines 26b and 26d are different portions of the same wiring line.

A description will now be given, with reference to FIGS. 3A and 3B, of a structure of a printed circuit board 28 according to a second embodiment of the present invention.

Figure 3A:
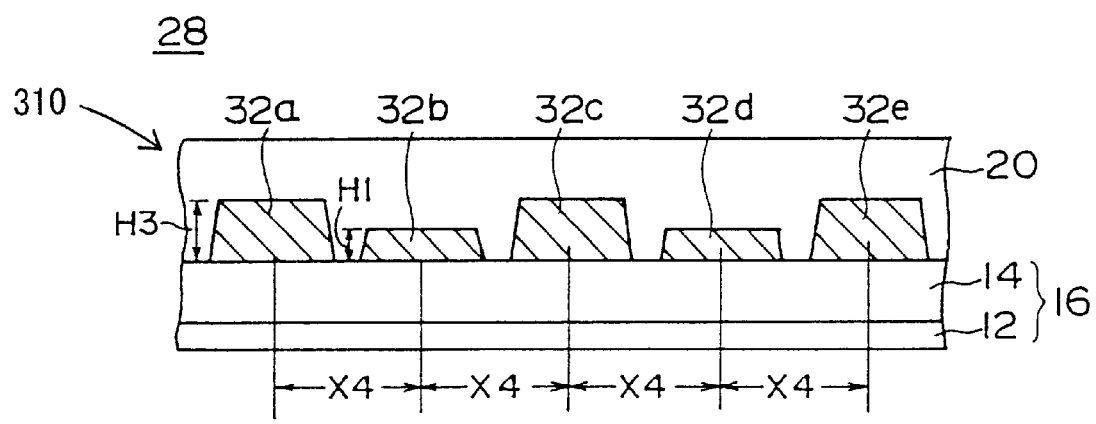
FIG. 3A is a partial cross-sectional view of a printed circuit board according to a second embodiment of the present invention.

FIG. 3A is a partial cross-sectional view of the printed circuit board 28, on which a plurality of wiring lines 32a through 32e are arranged, showing a region of narrow wiring pattern pitches. FIG. 3B is a partial perspective view of the wiring lines 32a and 32b including the portions thereof of which the cross sections are shown in FIG. 3A.

As shown in FIG. 3A, the wiring lines 32a through 32e are arranged on the board 16 with the pattern pitches X4, which is described in the first embodiment, in a region 310. The wiring lines 32a, 32c, and 32e has a thickness H3 which corresponds to the thickness H1-1 or H2-1 described in the first embodiment, and the wiring lines 32b and 32d has the thickness H1 described in the first embodiment, which is thinner than the thickness H3. That is, the wiring line 32b, as well as the wiring line 32d, is formed to have a portion of the thinner thickness H1 (or a first portion) in the region 310 compared with the other wiring lines 32a, 32c, and 32e.

The wiring lines 32b and 32d are laid out between the wiring lines 32a and 32c, and between the wiring lines 32c and 32e, respectively, so that each of the wiring lines having the thickness H3 will be placed adjacently to each of the wiring lines having the thickness H1.

Figure 3B:
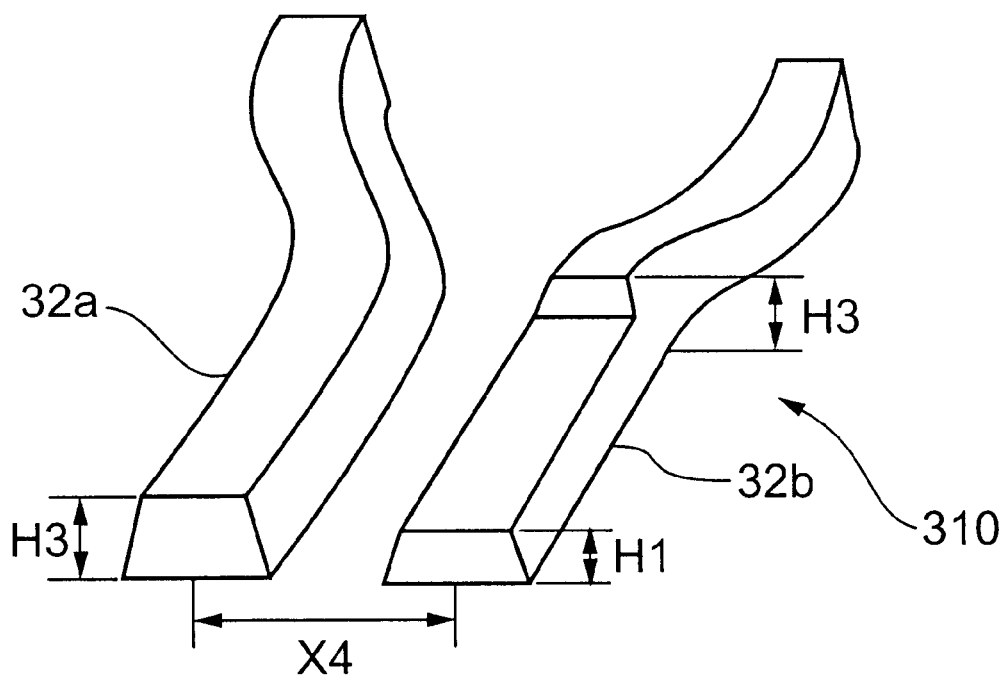
FIG. 3B is a partial perspective view of wiring lines formed on the printed circuit board of FIG. 3A.

Therefore, for example, the area Sm of the overlapping part of the facing surfaces of the wiring line 32a (or a second wiring line) and the wiring line 32b (or a first wiring line) per unit length is smaller than that of the overlapping part of the facing surfaces of wiring lines of the thickness H3 per unit length which are laid out with the pattern pitch X4 (See FIG. 3B). Thus, a mutual capacitance between the adjacent wiring lines 32a and 32b is smaller than that between the above wiring lines of the thickness H3 per unit length which are laid out with the pattern pitch X4, making the value of K obtained from the above formula a desired small value. The same holds true for the other pairs of the adjacent wiring lines shown in FIG. 3A.

According to the printed circuit board 28 having the above structure, in a region wherein wiring lines are laid out with the pattern pitches X4, the noise level of a crosstalk noise generated between adjacent two of the wiring lines is lowered to the extent that no problem is incurred.

Figure 4:
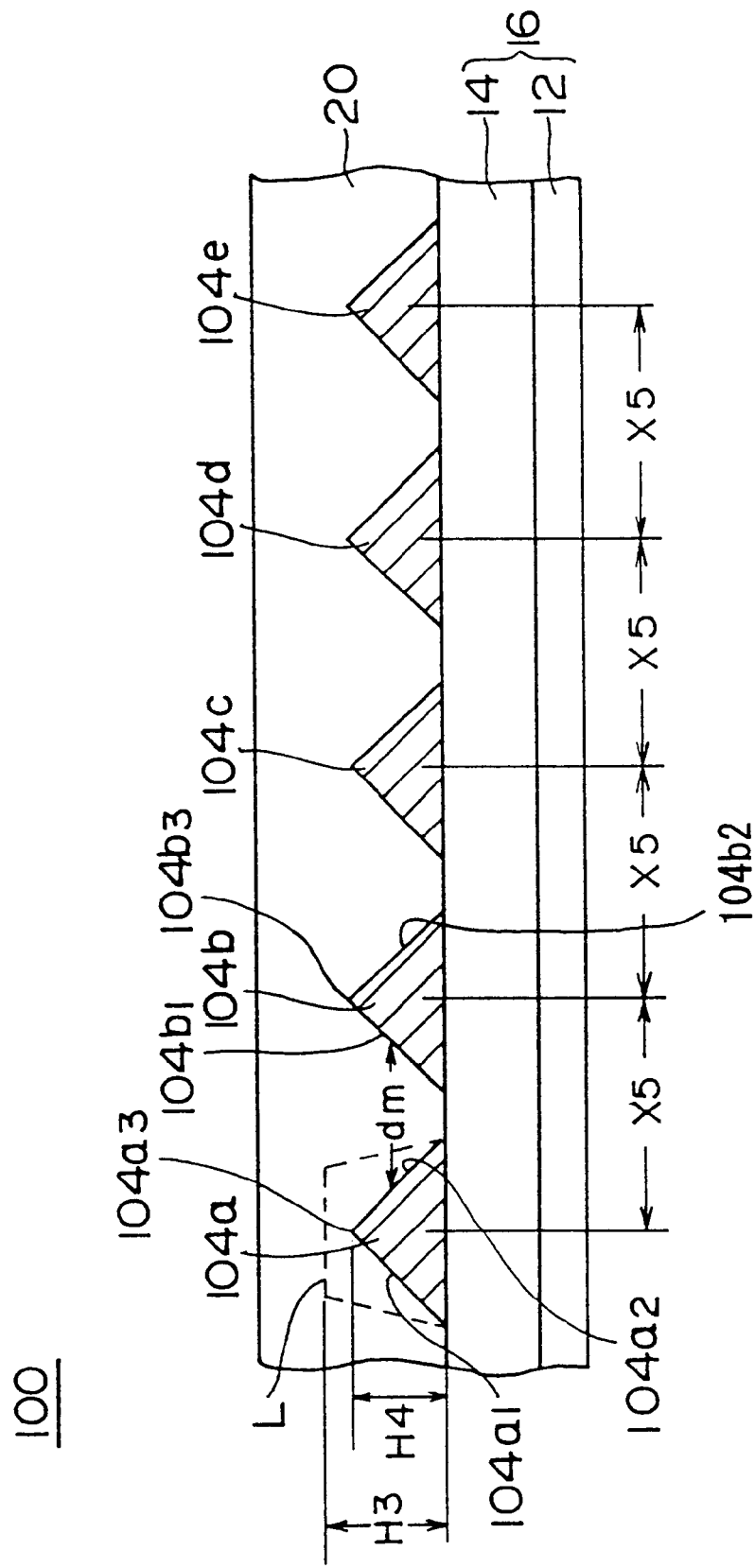
FIG. 4 is a partial cross-sectional view of a printed circuit board according to a third embodiment of the present invention.

FIG. 4 is a partial cross-sectional view of a printed circuit board 100 showing a region wherein wiring lines are laid out with extremely narrow pattern pitches according to a third embodiment of the present invention.

Wiring lines 104a through 104e correspond, for example, to the wiring lines 26c and 26d of the first embodiment, and are arranged on the board 16 with extremely narrower pattern pitches X5 than the pattern pitch X4 of the first embodiment. For the convenience of a description, a wiring line L having the thickness H3 described in the second embodiment is shown by dotted lines over the wiring line 104a in FIG. 4. In this case, the wiring line 104a is formed by trimming off both shoulder portions of a wiring line having the thickness H4 slightly thinner than the wiring line L so as to have a triangular cross-sectional shape with slopes 104a1 and 104a2. Therefore, the thickness H4 between the surface of the board 16 and a top portion 104a3 of the wiring line 104a is thinner than the thickness H3. The other wiring lines 104b through 104e have the same cross-sectional shape and slopes as the above described wiring line 104a.

The adjacent wiring lines 104a and 104b are laid out with the slope 104a2 and a slope 104b1 facing each other to form a V shape between the wiring lines 104a and 104b. Therefore, a distance dm between the slopes 104a2 and 104b1 gradually extends toward the top portion 104a3 and a top portion 104b3. Thus, a mutual capacitance between the adjacent wiring lines 104a and 104b is smaller than that between adjacent wiring lines having rectangular cross-sectional shapes which are laid out with the pattern pitch X5, making the value of K obtained from the above formula a desired value small enough to lower the noise level of the crosstalk noise between the wiring lines 104a and 104b to the extent that no problem is incurred. The same holds true for the other pairs of the adjacent wiring lines shown in FIG. 4.

According to the printed circuit board 100 having the above structure according to the third embodiment of the present invention, in a region wherein wiring lines are laid out with the pattern pitches X5, the level of a crosstalk noise generated between adjacent two of the wiring lines is lowered to the extent that no problem is incurred.

In this case, the thickness H4 between the surface of the board 16 and the top portion 104a3 of the wiring line 104a may be set as thick as or slightly thicker than the thickness H3 as far as the value of K is maintained to the desired small value. When the thickness H4 is set as thick as the thickness H3 in the above case, the wiring lines 104a through 104e can easily be formed only by trimming off both shoulder portions of the wiring line L without changing the thickness. Further, each of the wiring lines 104a through 104e may be formed so as to have a trapezoidal cross-sectional shape of which an upper side is shorter than a lower side thereof remaining in contact with the surface of the board 16, instead of the triangular cross-sectional shape.

A description will now be given of a method of forming wiring lines on a board to form a printed circuit board according to a fourth embodiment of the present invention with reference to FIGS. 5A through 5D.

Figure 5A:
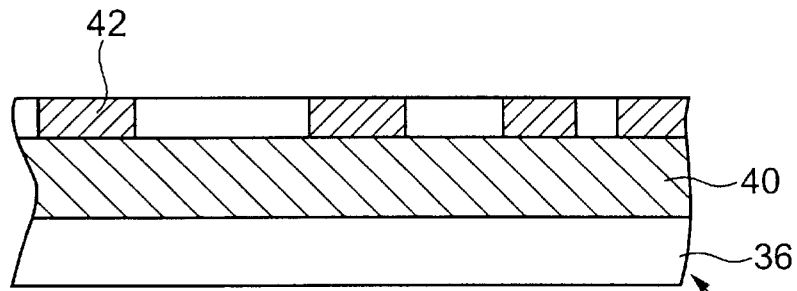
FIGS. 5A through 5D are diagrams illustrating a method of forming wiring lines on a board to firm a printed circuit board according to a fourth embodiment of the present invention.
Figure 5B:
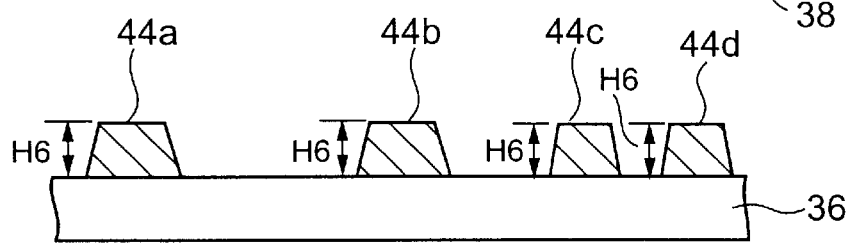

First, a board 38 including a core layer 36 formed on a GND layer (not shown) should first be prepared. Next, as shown in FIG. 5A, a conductive paste made of a conductive material is applied on the board 38 so as to form a conductive paste layer 40 thereon. Then, a mask 42 is placed on the conductive paste layer 40 so as to form a wiring pattern thereon.

Next, after an etching liquid or etchant is sprayed on unmasked portions of the conductive paste layer 40, the conductive paste layer 40 is etched so that wiring lines 44a through 44d will be formed according to the wiring pattern as shown in FIG. 2B. In this case, every wiring line is formed so as to have a uniform thickness H6.

Figure 5C:
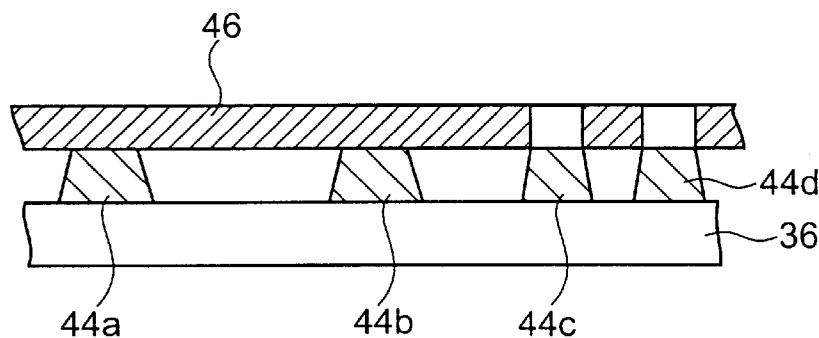
Figure 5D:
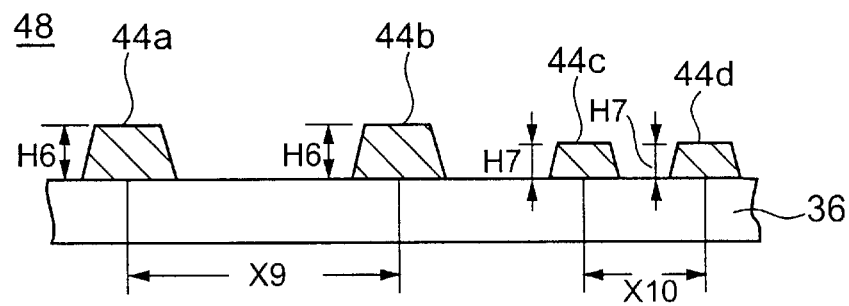

Then, a mask 46 is provided so that only the wiring lines 44c and 44d will be unmasked as shown in FIG. 5C. Then, each of the wiring lines 44c and 44d is etched, after the etching liquid is sprayed thereon, to have a thickness H7, which is thinner than the thickness H6, as shown in FIG. 5D.

Thereby, formed is a printed circuit board 48 on which the wiring lines 44a and 44b, each having the thickness H6, are formed with a pattern pitch X9, and the wiring lines 44c and 44d, each having the thickness H7, are formed with a pattern pitch X10, which is narrower than the pattern pitch X9. Herein, the wiring lines 44a through 44d may be referred to as a first through a fourth wiring line, respectively.

According to the above method of forming the wiring lines on the board to form the printed circuit board according to the fourth embodiment of the present invention, the printed circuit board 48 of the present invention may properly be formed.

A description will now be given of a method of forming wiring lines on a board to form a printed circuit board according to a fifth embodiment of the present invention with reference to FIGS. 6A through 6D.

Figure 6A:
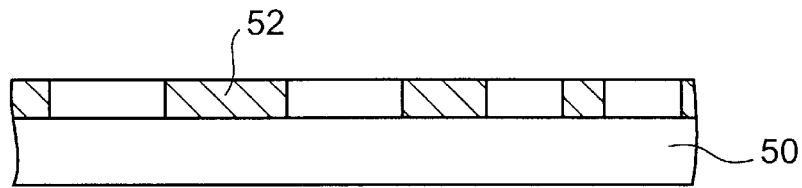
FIGS. 6A through 6D are diagrams illustrating a method of forming wiring lines on a board to form a printed circuit board according to a fifth embodiment of the present invention.
Figure 6B:
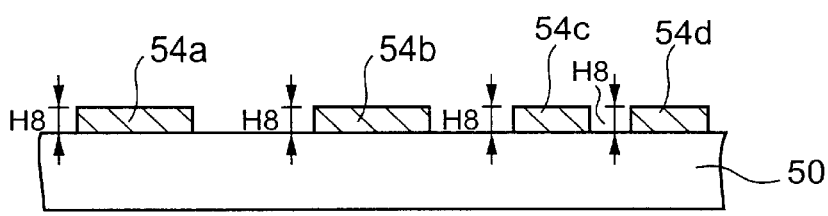

As shown in FIG. 6A, a mask 52 is first placed on a core layer 50 so as to form a wiring pattern thereon. Then, a conductive paste made of a conductive material is applied, or evaporated on unmasked portions of the core layer 50 to form wiring lines 54a through 54d according to the wiring pattern as shown in FIG. 6B. In this case, every wiring line is formed to have a uniform thickness H8.

Figure 6C:
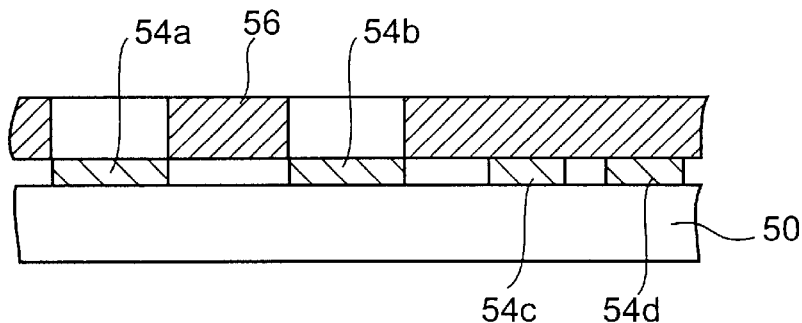
Figure 6D:
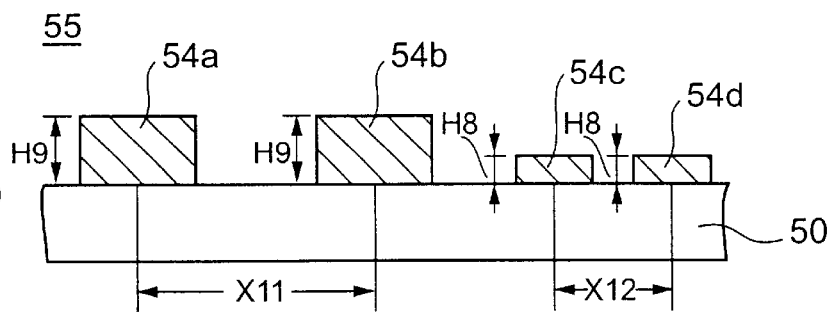

Next, a mask 56 is provided so that only the wiring lines 54a and 54b will be unmasked as shown in FIG. 6C. Then, the conductive paste made of the conductive material is applied, or evaporated on the wiring lines 54a and 54b so that the wiring lines 54a and 54b will be formed to have a thickness H9, which is thicker than the thickness H8, as shown in FIG. 6D.

Thereby, formed is a printed circuit board 55 on which the wiring lines 54a and 54b, each having the thickness H9, are formed with a pattern pitch X1, and the wiring lines 54c and 54d, each having the thickness H8, are formed with a pattern pitch X12, which is narrower than the pattern pitch X11. Herein, the wiring lines 54a through 54d may be referred to as a first through a fourth wiring line, respectively.

According to the above method of forming the wiring lines on the board to form the printed circuit board according to the fifth embodiment of the present invention, the printed circuit board 55 of the present invention may properly be formed as in the case of the above method of forming the wiring lines on the board to form the printed circuit board according to the fourth embodiment of the present invention.

A description will now be given of a method of forming wiring lines on a board to form a printed circuit board according to a sixth embodiment of the present invention with reference to FIGS. 7A and 7B.

Figure 7A:
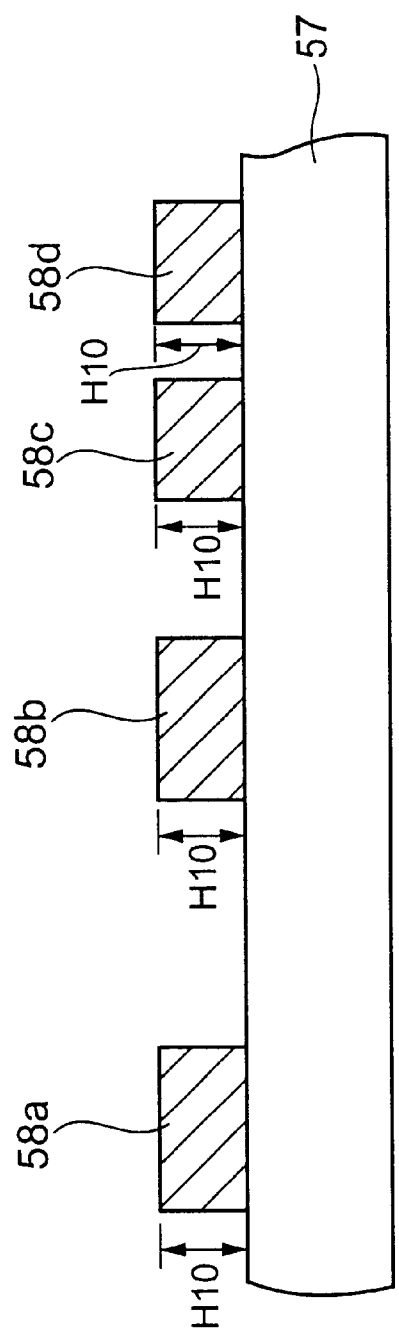
FIGS. 7A and 7B are diagrams illustrating a method of forming wiring lines on a board to form a printed circuit board according to a sixth embodiment of the present invention.

First, as shown in FIG. 7A, wiring lines 58a through 58d are formed according to a wiring pattern on a core layer 57 in the same method as described in the above embodiments of the present invention. In this case, every wiring line is formed to have a uniform thickness H10.

Figure 7B:
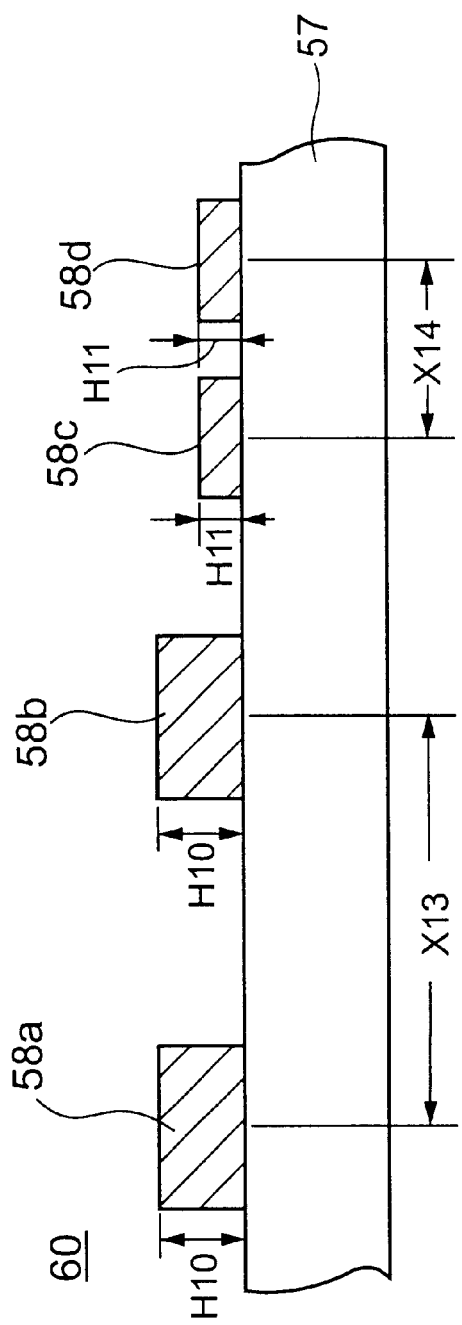

Next, each of only the wiring lines 58C and 58D is ground by using a mask or a template to have a thickness H11, which is thinner than the thickness H10, as shown in FIG. 7B.

Thereby, formed is a printed circuit board 60 on which the wiring lines 58a and 58b, each having the thickness H10, are formed with a pattern pitch X13, and the wiring lines 58c and 58d, each having the thickness H11, are formed with a pattern pitch X14, which is narrower than the pattern pitch X13. Herein, the wiring lines 58a through 58d may be referred to as a first through a fourth wiring line, respectively.

According to the above method of forming the wiring lines on the board to form the printed circuit board according to the sixth embodiment of the present invention, the printed circuit board 60 of the present invention may properly be formed as in the case of the above method of forming the wiring lines on the board to form the printed circuit board according to the fourth embodiment of the present invention.

A description will now be given of a method of forming wiring lines on a board to form a printed circuit board according to a seventh embodiment of the present invention with reference to FIGS. 8A through 8E.

In this method, the wiring lines of the printed circuit board 100 shown in FIG. 4 are formed.

Figure 8A:
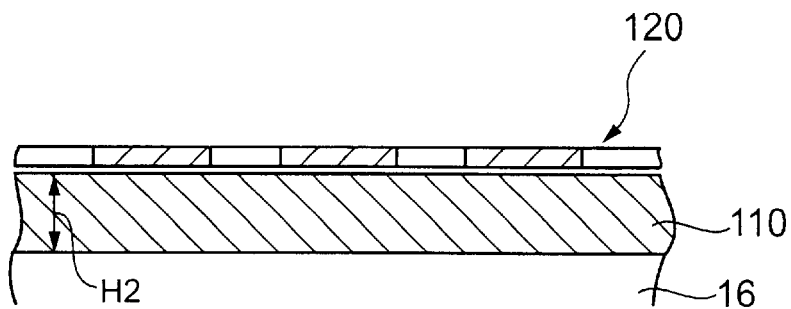
FIGS. 8A through 8E are diagrams illustrating a method of forming wiring lines on a board to form a printed circuit board according to a seventh embodiment of the present invention.

First, a conductive paste made of a conductive material is applied on the board 16 to form a conductive paste layer 110 thereon, and a mask 120 is placed on the conductive paste layer 110 so as to form a wiring pattern thereon as shown in FIG. 8A.

Figure 8B:
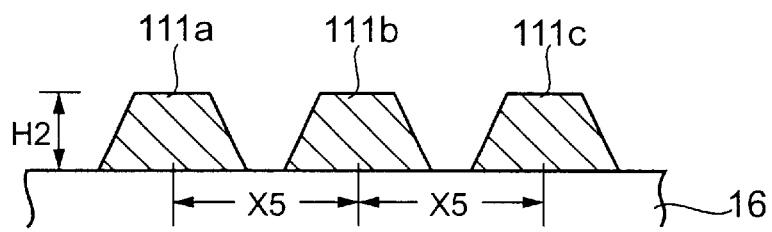

Next, as shown in FIG. 8B, the conductive paste layer 110 is etched according to the wiring pattern so as to form wiring lines 111a through 111c, each having the thickness H2 shown in FIG. 2B, with the pattern pitches X4 shown in FIG. 4.

Figure 8C:
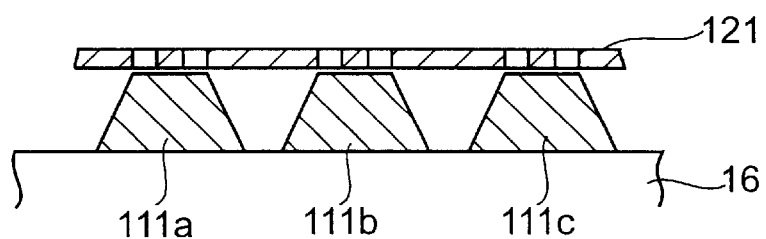

Next, as shown in FIG. 8C, a mask 121 is provided so as to etch both shoulder portions of each of the wiring lines 111a through 111c. With the mask 121 being provided, portions between the adjacent two of the wiring lines 111a through 111c, and a center portion along a longitudinal center line of a top surface of each of the wiring lines 111a through 111c are masked, while the rest of the top surface of each of the wiring lines 111a through 111c, which corresponds to top surfaces of both of the shoulder portions thereof, remains unmasked.

Figure 8D:
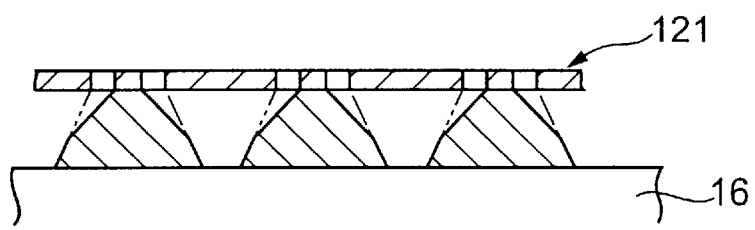

Then, as shown in FIG. 8D, an etching process is performed for a predetermined period of time so that both of the shoulder portions of each of the wiring lines 111a through 111c will be etched, having undercuts around a top longitudinal center portion thereof.

Figure 8E:
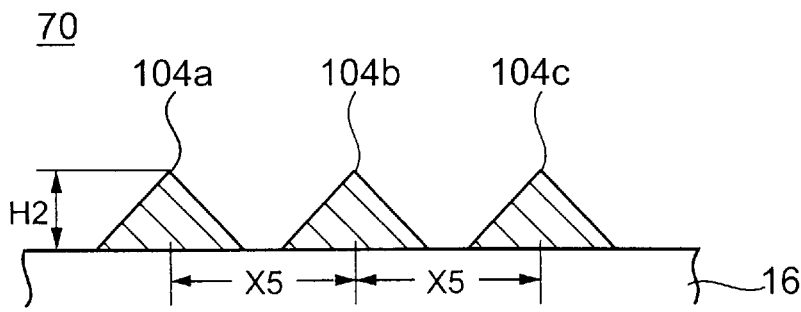

Thereby, as shown in FIG. 8E, formed is a printed circuit board 70 on which the wiring lines 111a through 111c, each having the thickness H2 and the triangular cross-sectional shape, are formed with the pattern pitches X5.

According to the above method of forming the wiring lines on the board to form the printed circuit board according to the seventh embodiment of the present invention, the printed circuit board 70 of the present invention may properly be formed as in the case of the above method of forming the wiring lines on the board to form the printed circuit board according to the fourth embodiment of the present invention.

The present invention is not limited to the specifically disclosed embodiments, and variations and modifications may be made without departing from the scope of the present invention.

The present application is based on Japanese priority application No. 11-340815 filed on Nov. 30, 1999, the entire contents of which are hereby incorporated by reference.

What is claimed is:

1. A printed circuit board comprising:

a first wiring line; and a second wiring line spaced apart from the first wiring line, the first wiring line having first and second portions, the first portion having a surface which faces the second wiring line and is smaller in area than that of the second portion, so that a crosstalk noise between the first portion of the first wiring line and the second wiring line can be reduced.

2. The printed circuit board as claimed in claim 1, wherein the second wiring line has third and fourth portions, the third portion having a surface which faces the first wiring line and is smaller in area than that of the fourth portion, so that a crosstalk noise between the third portion of the second wiring line and the first wiring line can be reduced.

3. The printed circuit board as claimed in claim 1, wherein the first portion of the first wiring line is thinner than the second portion thereof.

4. The printed circuit board as claimed in claim 1, wherein the first portion of the first wiring line has a triangular cross-sectional shape.

5. The printed circuit board as claimed in claim 1, wherein the first portion of the first wiring line has a trapezoidal cross-sectional shape.

6. The printed circuit board as claimed in claim 2, wherein the first portion of the first wiring line is thinner than the second portion thereof, and the third portion of the second wiring line is thinner than the fourth portion thereof.

7. The printed circuit board as claimed in claim 6, wherein the first portion of the first wiring line and the third portion of the second wiring line have an identical height.

8. The printed circuit board as claimed in claim 7, wherein the first portion of the first wiring line faces the third portion of the second wiring line.

9. The printed circuit board as claimed in claim 7, wherein:
the first portion of the first wiring line faces the third portion of the second wiring line;
the second portion of the first wiring line faces the fourth portion of the second wiring line; and
a distance between the first and third portions is shorter than that between the second and fourth portions.

10. The printed circuit board as claimed in claim 6, wherein the first portion of the first wiring line faces the third portion of the second wiring line.

11. The printed circuit board as claimed in claim 6, wherein:
the first portion of the first wiring line faces the third portion of the second wiring line;
the second portion of the first wiring line faces the fourth portion of the second wiring line; and
a distance between the first and third portions is shorter than that between the second and fourth portions.

12. The printed circuit board as claimed in claim 2, wherein the first portion of the first wiring line and the third portion of the second wiring line have a triangular cross-sectional shape.

13. The printed circuit board as claimed in claim 12, wherein the first portion of the first wiring line and the third portion of the second wiring line have an identical height.

14. The printed circuit board as claimed in claim 13, wherein the first portion of the first wiring line faces the third portion of the second wiring line.

15. The printed circuit board as claimed in claim 12, wherein the first portion of the first wiring line faces the third portion of the second wiring line.

16. The printed circuit board as claimed in claim 2, wherein the first portion of the first wiring line and the third portion of the second wiring line have a trapezoidal cross-sectional shape.

17. The printed circuit board as claimed in claim 16, wherein the first portion of the first wiring line and the third portion of the second wiring line have an identical height.

18. The printed circuit board as claimed in claim 17, wherein the first portion of the first wiring line faces the third portion of the second wiring line.

19. The printed circuit board as claimed in claim 16, wherein the first portion of the first wiring line faces the third portion of the second wiring line.

20. The printed circuit board as claimed in claim 1, further comprising:
a third wiring line; and
a fourth wiring line spaced apart from the third wiring line,
the third wiring line having first and second portions, the first portion having a surface which faces the fourth wiring line and is larger in area than that of the second portion.

21. The printed circuit board as claimed in claim 20, wherein the fourth wiring line has third and fourth portions, the third portion having a surface which faces the third wiring line and is larger in area than that of the fourth portion.

22. The printed circuit board as claimed in claim 21, wherein the first portion of the third wiring line is thicker than the second portion thereof, and the third portion of the fourth wiring line is thicker than the fourth portion thereof.

23. The printed circuit board as claimed in claim 22, wherein the first portion of the third wiring line and the third portion of the fourth wiring line have an identical height.

24. The printed circuit board as claimed in claim 23, wherein the first portion of the third wiring line faces the third portion of the fourth wiring line.

25. The printed circuit board as claimed in claim 20, wherein the first portion of the third wiring line is thicker than the second portion thereof.

26. The printed circuit board as claimed in claim 22, wherein the first portion of the third wiring line faces the third portion of the fourth wiring line.

27. A printed circuit board comprising:
a first wiring line; and
a second wiring line spaced apart from the first wiring line,
the first wiring line including a first portion having a surface which faces the second wiring line and is smaller in area than a surface of the second wiring line which faces the first portion of the first wiring line, so that a crosstalk noise between the first portion of the first wiring line and the second wiring line can be reduced.

28. The printed circuit board as claimed in claim 27, wherein the first portion of the first wiring line is thinner than the second wiring line.

29. The printed circuit board as claimed in claim 27, further comprising:
a third wiring line; and
a fourth wiring line spaced apart from the first wiring line,
the third wiring line including a first portion having a surface which faces the fourth wiring line and is larger in area than a surface of the fourth wiring line which faces the first portion of the third wiring line.

30. The printed circuit board as claimed in claim 29, wherein the first portion of the third wiring line is thicker than the fourth wiring line.

* * * * *